US012805225B2

(12) United States Patent
Lin et al.

(10) Patent No.: US 12,805,225 B2
(45) Date of Patent: Nov. 17, 2026

(54) OXIDATION BASED ATOMIC LAYER ETCHING

(71) Applicant: Tokyo Electron Limited, Tokyo (JP)

(72) Inventors: Kangyi Lin, Albany, NY (US); Peng Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 18/414,252

(22) Filed: Jan. 16, 2024

(65) Prior Publication Data

US 2025/0232982 A1 Jul. 17, 2025

(51) Int. Cl.
*H10P 50/00* (2026.01)
*H10P 50/24* (2026.01)

(52) U.S. Cl.
CPC .......... *H10P 50/242* (2026.01); *H10P 50/695* (2026.01)

(58) Field of Classification Search
CPC ............................ H10P 50/242; H10P 50/695
See application file for complete search history.

(56) References Cited

U.S. PATENT DOCUMENTS

2008/0286978 A1 11/2008 Chen et al.
2014/0241493 A1* 8/2014 Yokoyama ............ C25D 7/123 378/147
2016/0314981 A1 10/2016 Yoon et al.
2017/0053808 A1 2/2017 Kamp et al.
2017/0338122 A1 11/2017 Daulton
2021/0305383 A1* 9/2021 Mao .................. H10D 30/6219
2022/0254622 A1* 8/2022 Olsen ................. H10P 14/6308
2022/0375763 A1* 11/2022 Hirata .................. H10P 50/283
2023/0386914 A1* 11/2023 Ko ...................... H10D 30/024

OTHER PUBLICATIONS

International Search Report and Written Opinion on PCT App. PCT/US2024/054424 dated Feb. 20, 2025 (10 pages).

* cited by examiner

*Primary Examiner* — Trang Q Tran
(74) *Attorney, Agent, or Firm* — Foley & Lardner LLP

(57) ABSTRACT

Atomic layer etching is provided. A method can include forming a mask layer over a semiconductive layer. The method can include forming an opening in the hardmask layer, oxidizing a surface of the semiconductive layer, depositing a sacrificial layer over the hardmask layer, and removing the oxidized surface of the semiconductive layer. The oxidation step, the deposition step, and the removal step can be repeated to extend the opening through the semiconductive layer.

20 Claims, 11 Drawing Sheets

OXIDATION BASED ATOMIC LAYER ETCHING

FIELD OF THE DISCLOSURE

This disclosure relates to microelectronic devices including semiconductor devices, transistors, and integrated circuits, including methods of microfabrication. Particularly, the semiconductor devices can include openings formed for deposition of conductive elements, dielectric spacers, or other elements therein.

BACKGROUND

In the manufacture of semiconductor devices (especially on the microscopic scale), various fabrication processes are executed, for example, film-forming depositions, etch mask creation, patterning, material etching and removal, and doping treatments, among others. These processes can be performed repeatedly to form desired semiconductor device elements on a substrate. Historically, with microfabrication, transistors have been created in one plane, with wiring or metallization formed above the active device plane and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes, and additional device capacity or density is used. Semiconductor device fabricators have expressed a desire for three-dimensional (3D) semiconductor circuits for high density, high performance memory and logic applications. For example, 3D semiconductor circuits can include stacked elements such as transistors in various arrangements including complementary field effect transistors (CFETs), transistors having body diodes, etc. Such devices can be manufactured according to cyclic or long duration process than can cause flared, re-entrant, or other profiles formed at a surface of a device, which can limit device density according to a spacing therefor.

SUMMARY

An atomic layer etching process can form openings in a semiconductive material. The process can include oxidizing a surface of the semiconductive material and removing an oxide formed according to the oxidizing step. A protective layer can be formed over the semiconductor device to protect other portions from the etchant. For example, the protective layer can be formed over a hardmask of the device. The protective layer can be deposited subsequent to the oxidation and prior to the etching. The oxidation, formation of the protective layer, and etching of the oxides can be performed as a cyclic process. For example, the cycle can include sequentially alternating between the oxidation of silicon, the formation (e.g., deposition) of a protective layer, and the removal of silicon dioxide. In some embodiments, the protective layer may be applied every cycle, or a subset thereof (e.g., every n cycles). In some embodiments, a time, flow rate, energy level, or other parameter of the operations can be adjusted between instances thereof to control a profile of a sidewall of the opening.

The oxidation step can include flowing an oxidant (e.g., oxygen) over a semiconductor such as amorphous silicon to form an oxidized layer. The deposition step can include passing precursors which are not corrosive to back end of line applied materials (e.g., copper), over the semiconductor device. The precursors can be fluorinated or non-fluorinated. The precursors can form a protective (e.g., sacrificial) layer over the semiconductor device, prior to the removal of the oxidized surface of the semiconductor. The oxidized surface can thereafter be removed according to a chemically reactive etchant configured to selectively remove an oxidized layer at the surface of the device ($SiO_2$). The etchant can be selective to the oxidized layer, relative to the semiconductor such that dimensional control (e.g., etch depth, sidewall profile, etc.) can be realized.

The techniques described herein include methods and devices for 3D fabrication of semiconductor devices. Techniques herein can be used for any geometry device (e.g., circular, rectangular, or elliptical). For example, in some embodiments, the transistor may be substantially circular along a lateral plane, with the channel concentrically circumscribed by one gate structure and concentrically circumscribing another gate structure.

Of course, the order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

At least one aspect of the present disclosure is directed to a method for fabricating semiconductor devices. The method includes forming a hardmask layer over a semiconductive layer. The method includes forming an opening in the hardmask layer. The method includes oxidizing a surface of the semiconductive layer. The method includes depositing a sacrificial layer over the hardmask layer. The method includes removing the oxidized surface of the semiconductive layer.

In some embodiments, the method includes repeating the oxidation step, the deposition step, and the removal step to extend the opening through the semiconductive layer. In some embodiments, the method includes detecting a position of the surface of the semiconductive layer and adjusting a number of the repetitions of the oxidation step, the number based on the detected position. In some embodiments, the oxidation step is repeated a predetermined number of times.

In some embodiments, a time, flow rate of an etchant, or quantity of repetitions of the removal step is varied between a first instance of the step and a second instance of the step, the variance configured to adjust a sidewall profile of the opening. In some embodiments, the method includes extending the opening to a second semiconductive layer. The method can include filling the opening with a conductive element to electrically couple the semiconductive layer with the second semiconductive layer, wherein the second semiconductive layer is of a different material or type than the semiconductive layer. In some embodiments, the semiconductive layer comprises amorphous silicon.

In some embodiments, the sacrificial layer is formed from one or more precursors comprising methane (CH4), methyl fluoride ($CH_3F$), methylene fluoride ($CH_2F_2$), fluoroform ($CHF_3$), hexafluoro-1,3-butadiene ($C_4F_6$), octafluorocyclobutane ($C_4F_8$), hydrogen ($H_2$), oxygen ($O_2$), nitrogen ($N_2$), argon (Ar), helium (He), carbon dioxide ($CO_2$), carbon monoxide (CO), carbonyl sulfide (COS), or sulfur dioxide ($SO_2$).

In some embodiments, the removal step includes introducing an etchant gas to a process chamber. The etchant gas can include methyl fluoride ($CH_3F$), difluoromethane ($CH_2F_2$), trifluoromethane ($CHF_3$), tetrafluoromethane ($CF_4$), hexafluoro-1,3-butadiene ($C_4F_6$), octafluorocyclobutane ($C_4F_8$), sulfur hexafluoride ($SF_6$), nitrogen trifluoride ($NF_3$), hydrogen ($H_2$), oxygen ($O_2$), nitrogen ($N_2$), argon (Ar), carbon dioxide ($CO_2$), carbon monoxide (CO), carbonyl sulfide (COS), or sulfur dioxide ($SO_2$).

In some embodiments, the process chamber is a capacitively coupled plasma (CCP) chamber, and the oxidation step and the deposition step are performed in the CCP. In some embodiments, the method includes removing the hardmask layer. A sidewall of the opening can extend along a first oxide layer-nitride layer pair between the hardmask layer and the semiconductive layer. The sidewall of the opening can extend along a second oxide layer-nitride layer pair between the semiconductive layer and a second semiconductive layer.

In some embodiments, oxidizing the surface of the semiconductive layer includes introducing an oxygen-based gas into a process chamber, the oxygen-based gas including carbon monoxide (CO), oxygen ($O_2$), carbon dioxide ($CO_2$), ozone ($O_3$), nitric oxide (NO), nitrogen dioxide ($NO_2$), sulfur dioxide ($SO_2$), or carbonyl sulfide (COS).

At least one aspect of the present disclosure is directed to a method for fabricating semiconductor devices. The method includes providing a semiconductor device. The provided semiconductor device can include a first semiconductive layer, a second semiconductive layer, a first dielectric portion between the first semiconductive layer and the second semiconductive layer, and a second dielectric portion between the first semiconductive layer and the second semiconductive layer. The method includes forming an opening extending from a surface of the semiconductor device to the second semiconductive layer. The formation can include oxidizing a surface of the first semiconductive layer, depositing a sacrificial layer over the semiconductor device, and removing the oxidized surface of the first semiconductive layer. The method includes repeating the oxidation step, the deposition step, and the removal step to extend the opening though the first semiconductive layer.

In some embodiments, the first semiconductive layer includes amorphous silicon and the second semiconductive layer includes silicon-germanium and boron. In some embodiments, the removal includes introducing an etchant gas into a process chamber. The etchant gas can include methyl fluoride ($CH_3F$), difluoromethane ($CH_2F_2$), trifluoromethane ($CHF_3$), tetrafluoromethane ($CF_4$), hexafluoro-1, 3-butadiene ($C_4F_6$), octafluorocyclobutane ($C_4F_8$), sulfur hexafluoride ($SF_6$), nitrogen trifluoride ($NF_3$), hydrogen ($H_2$), oxygen ($O_2$), nitrogen ($N_2$), argon (Ar), carbon dioxide ($CO_2$), carbon monoxide (CO), carbonyl sulfide (COS), or sulfur dioxide ($SO_2$). In some embodiments, the deposition step includes introducing a precursor into the process chamber. The precursor can include methane (CH4), methyl fluoride ($CH_3F$), methylene fluoride ($CH_2F_2$), fluoroform ($CHF_3$), hexafluoro-1,3-butadiene ($C_4F_6$), octafluorocyclobutane ($C_4F_8$), hydrogen ($H_2$), oxygen ($O_2$), nitrogen ($N_2$), argon (Ar), helium (He), carbon dioxide ($CO_2$), carbon monoxide (CO), carbonyl sulfide (COS), or sulfur dioxide ($SO_2$). In some embodiments, the oxidation step comprises passing oxygen over the surface of the semiconductor device in the process chamber. The process chamber can be a capacitively coupled plasma (CCP) chamber.

In some embodiments, the first dielectric portion includes a first layer comprising an oxide material and a second layer comprising a nitride material. The second dielectric portion can include a third layer comprising the oxide material and a fourth layer comprising the nitride material.

At least one aspect of the present disclosure is directed to a method for fabricating semiconductor devices. The method includes forming an oxide barrier layer over a silicon layer. The method includes patterning the oxide barrier layer to form openings extending to the silicon layer. The method includes extending the openings by performing steps including oxidizing a surface of the silicon layer to form silicon dioxide, depositing a sacrificial layer over the oxide barrier layer, removing the silicon dioxide via an introduction of one or more etchant gasses selectively reactive to the silicon dioxide relative to silicon.

In some embodiments, the silicon layer consists substantially of amorphous silicon and one or more dopants.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
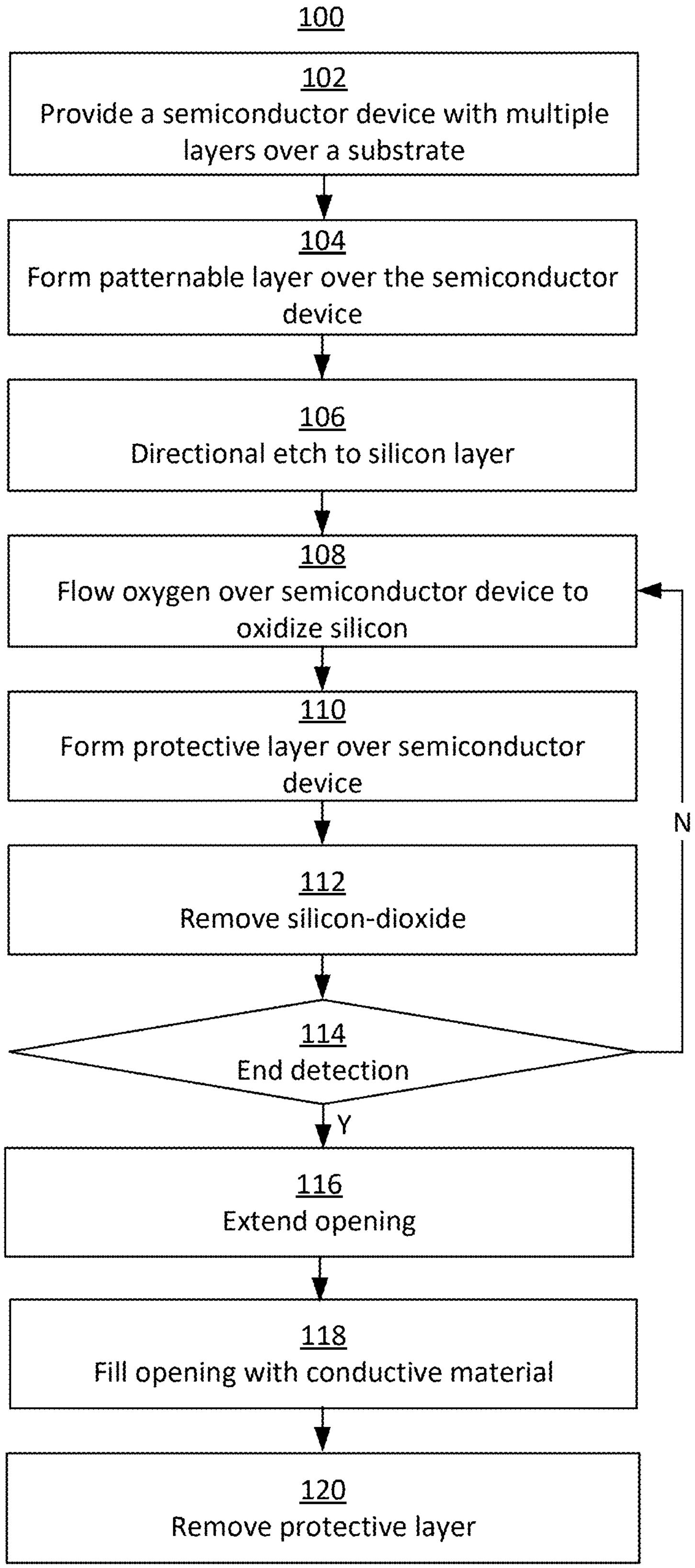
FIG. 1 is a flow diagram for a process flow to manufacture semiconductor devices, according to some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques herein include systems and methods for atomic layer etching of semiconductive materials such as silicon. The methods can include cyclic repetitions of various operations, such as oxidation, deposition, and etching, such that a process can remove a controlled portion of the semiconductive materials. A formation of an oxidized layer can be self-limiting, wherein the oxide layer blocks further portion of a semiconductive material from oxidation. An etchant can be introduced to remove the oxide layer, the etchant being selective to the oxide layer relative to the other semiconductor material (e.g., to silicon dioxide, relative to amorphous silicon).

The method can be cycled (repeated) to extend the opening downward through the semiconductive material. A protectant can be formed over the surface of the semiconductor device to prevent the etchant from removing an upper surface thereof. For example, various precursors can be introduced to deposit a protective layer over a mask (e.g., a tungsten-based hardmask). The protectant can be introduced between the oxidation and etching steps, such that the etching of the hardmask can be avoided. The protectant can be or include a sacrificial component which is reactive with (e.g., etched by) the etchant such that the protectant may be removed or degraded by the etchant. The protectant can be reapplied between various instances of the oxidation and etching steps. Thus, a cyclic process including oxidation of a semiconductive material, deposition of a protectant, and etching of an oxide of the semiconductive material can be performed.

In some embodiments, various aspects of the systems and methods discloses herein can be performed in a same process chamber. For example, the oxidation can be performed via an introduction of one or more oxide containing gasses into a process chamber (e.g., a capacitively coupled plasma (CCP) chamber). The protectant can be formed according to a deposition of a protectant formed from one or more precursors introduced into the CCP chamber. The etching can be performed via an introduction of an etchant or precursor therefor into the CCP chamber. The etchant or precursors thereof can include non-corrosive precursors, such as fluorinated or non-fluorinated gasses.

Some advantages with techniques herein include atomic layer control of etch depth, wherein etch stop layers can be omitted or reduced, increased taper control, decreased mask erosion, and further control of opening dimensions. The further control can correspond to denser devices, higher yields, higher aspect ratio openings, additional stacked layers of 3DIC, etc.

Reference will now be made to the figures, which for the convenience of visualizing the fabrication techniques described herein, illustrate a variety of materials undergoing a process flow in various cross-sectional views. Unless expressly indicated otherwise, each Figure represents one (or a set) of fabrication steps in a process flow for manufacturing the devices described herein. In the various views of the Figures, connections or intermediate layers, such as etch stop layers between depicted layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flowchart of an example method 100 for forming a semiconductor device. For example, the semiconductor device can include one or more semiconductive layers, such as semiconductive layers to form channels of transistors. Various semiconductive layers can be interconnected to form circuits, such as complementary field effect transistors (CFETs). In various embodiments, operations of the method 100 may be associated with cross-sectional views of an example semiconductor device at various fabrication stages as shown in FIGS. 2 to 11, which will be discussed in further detail below. It should be understood that the semiconductor device 200, shown in FIGS. 2 to 11, may include a number of other devices such as inductors, fuses, capacitors, coils, etc., while remaining within the scope of the present disclosure. For example, a semiconductor device can include further layers of stacked transistors or channel portions thereof and interconnections therebetween, which are spaced laterally or vertically from the depicted features.

In brief overview, the method 100 starts with operation 102 of providing a semiconductor device with multiple layers over a substrate. For example, the provision of the semiconductor device may be achieved by forming the various layers over the substrate thereof. The method 100 continues to operation 104 of forming a patternable layer over the semiconductor device. The method 100 continues to operation 106 of directionally etching to a semiconductive (e.g., silicon) layer. The method 100 continues to operation 108 of flowing oxygen over the semiconductor device. The method 100 continues to operation 110 of forming a protective layer over the semiconductor device. The method 100 continues to operation 112 of removing silicon dioxide from the semiconductor device to extend the opening through the silicon. The method 100 continues to operation 114 of performing end detection to determine whether the opening extends a distance through the silicon layer. Responsive to a determination that the opening does not extend the distance through the silicon layer, the method 100 can proceed to operation 108; responsive to a determination that the opening extends through the silicon layer, the method 100 can proceed to operation 116. The method 100 continues to operation 116 of extending the opening. The method 100 continues to operation 118 of filling the opening with a conductive material. The method 100 continues to operation 120 of removing the protective layer. Various operations of the present disclosure can be omitted, substituted, or added. For example, in some embodiments, a method including operation 108, operation 110, operation 112, and operation 114 can be employed to extend an opening through a semiconductive material (e.g., amorphous silicon). In some embodiments, the opening can be extended prior to performing operation 108, operation 110, operation 112, and operation 114 (e.g., an embodiment, wherein the silicon layer is a bottommost layer in a stack up).

Figure 2:
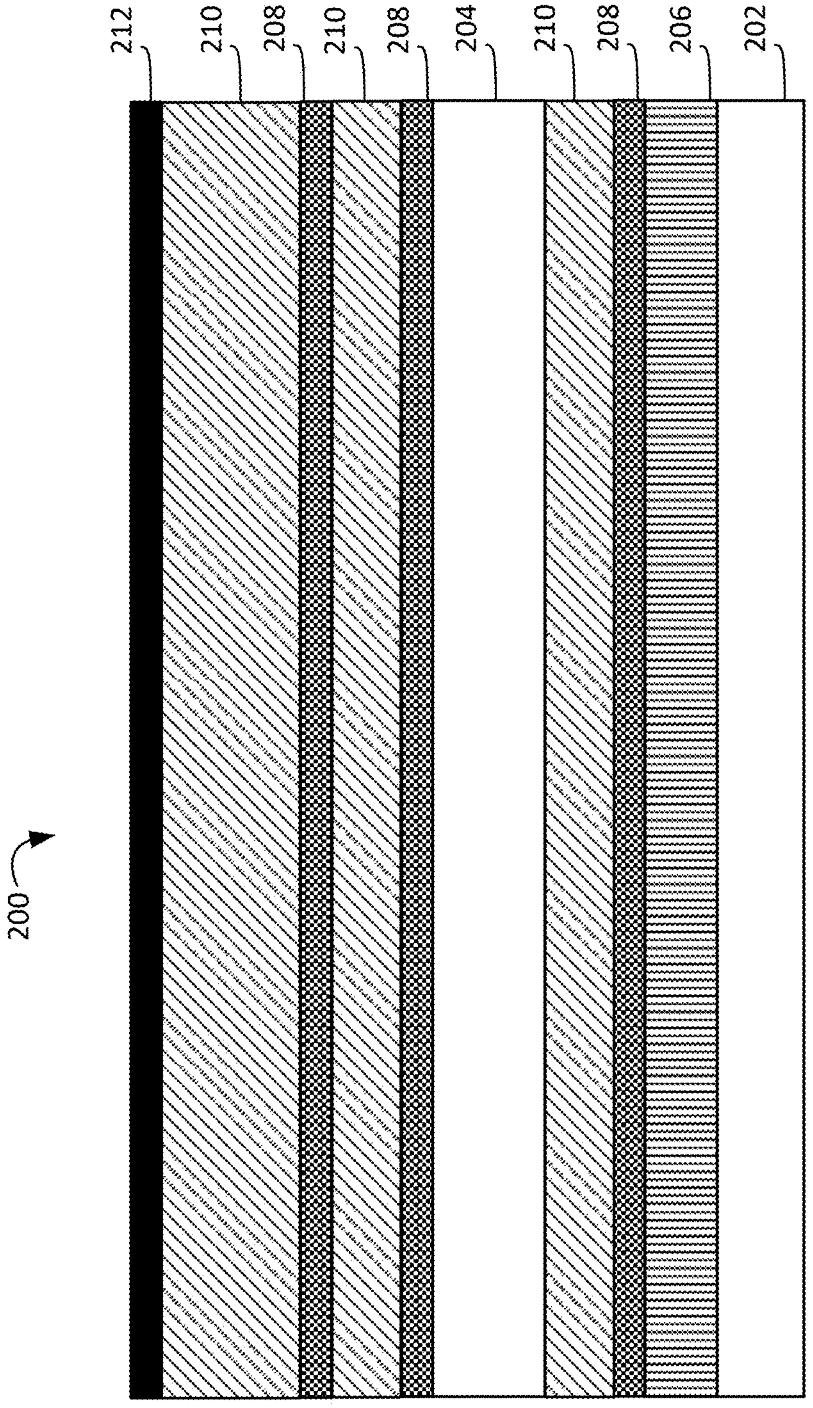
FIGS. 2-11 illustrate respective views of a semiconductor device during various fabrication stages of the method of FIG. 1, in accordance with some embodiments.

Corresponding to operation 102 of FIG. 1, FIG. 2 is a cross-sectional view of the semiconductor device 200 in which a semiconductor device 200 with multiple layers over a substrate 202 is provided. As shown in FIG. 2, various dielectric layers are disposed (e.g., formed) over the substrate 202. The substrate 202 can include a glass substrate 202 or semiconductor material substrate 202, for example, silicon (e.g., crystalline silicon). Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide.

According to various embodiments, various layers can be formed over the substrate 202. The layers can include one or more semiconductive layers. For example, a first semiconductive layer 204 can be or include silicon and a second semiconductive layer 206 can be or include silicon-germanium, or another material. The first semiconductive layer 204 and the second semiconductive layer 206 can be separated by one or more dielectric layers. For example, an oxide-nitride pair including a nitride layer 208 (e.g., silicon nitride, $Si_3N_4$) and oxide layer 210 (e.g., silicon dioxide, $SiO_2$). The dielectric layers can separate the first semiconductive layer 204 or the second semiconductive layer 206 from the substrate 202 or a surface of the semiconductor device 200. For example, as depicted, another oxide-nitride pair can separate the second semiconductive layer 206 from the substrate 202, or the first semiconductive layer 204 from the surface of the semiconductor device 200. One or more of the dielectric layers can be configured to separate the semiconductive layers, wherein an opening formed therein can interconnect the semiconductive layers to form various circuits. One or more of the dielectric layers can be an overburden layer such as an uppermost nitride layer 208 or oxide layer 210. For example, the overburden layer can be configured to include any entrant flaring, re-entrant underetch, etc.

A mask 212, such as a hardmask layer, (e.g., tungsten carbide, $WC_X$), can cover a surface of the semiconductor device 200. Any of the mask 212, the overburden layers described above, or other layers formed over the semiconductor device 200 (e.g., the protective layer 602 of FIG. 6) can be referred to as an oxide barrier, the oxide barrier layer to prevent oxidation of the non-exposed portions of a semiconductive material such as amorphous silicon of the first semiconductive layer 204. As indicated above, the depicted layers are merely intended to correspond to an illustrative example of the present disclosure. Additional, fewer, or different layers can be included in various embodiments. For example, an etch stop layer may be formed between various layers of the semiconductor device 200. For example, the etch stop layer may be formed over the first semiconductive layer 204 or the second semiconductive layer 206.

Figure 3:
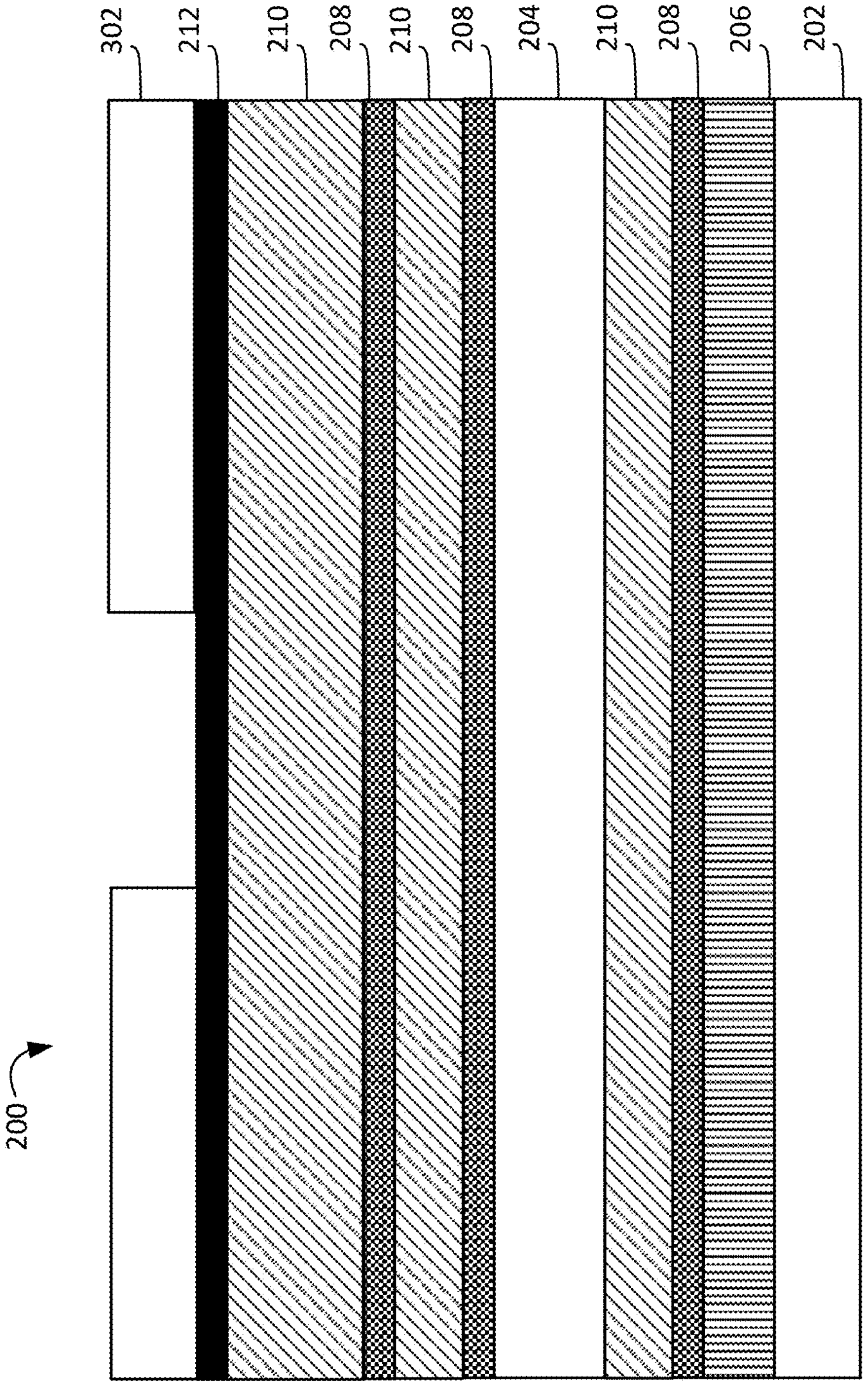

Corresponding to operation 104 of FIG. 1, FIG. 3 is a cross-sectional view of the semiconductor device 200 in which a patternable layer 302 is formed over the semiconductor device 200. The patternable layer 302, such as a positive or negative photoresist mask with patterns can be formed over the semiconductor device 200. The patternable layer 302 may include a periodic pattern such that periodic openings are formed across the semiconductor device 200, including openings depicted hereinafter. The patternable layer 302 may interface with a photoresist, or another material (e.g., hardmask or other mask material) formed into openings of the first patternable layer to form a patterned layer. The upper surface of the semiconductor device 200 and the patternable layer 302 may have different etching selectivity's. For example, the patternable layer 302 may be more resistive to an etchant than the material of the semiconductor device 200.

Figure 4:
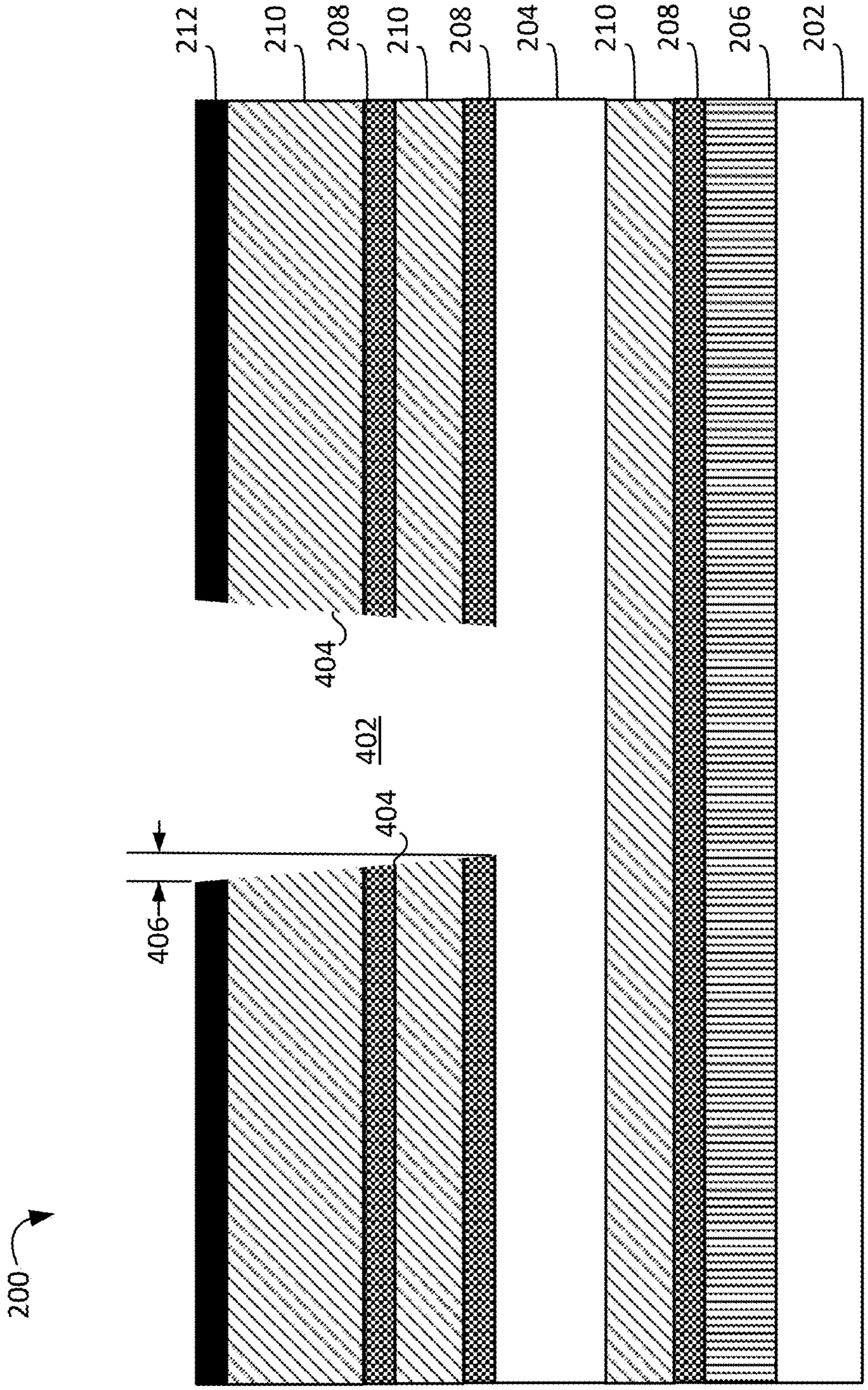

Corresponding to operations 106 of FIG. 1, FIG. 4, is a cross-sectional view of the semiconductor device 200 in which an opening 402 is formed by removing a portion of one or more layers of the semiconductor device 200. The opening 402 can include a trench opening 402, extending into and out of the page, a generally symmetrical circular opening 402, or another profile shape opening 402. The opening 402 can be formed via one or more sub-operations, which can include isotropic or anisotropic processes. For example, a first sub-operation can include a removal of a tungsten-based hardmask via, for example, wet etching, or laser ablation. In some embodiments, the removal can be according to a plasma etching, (e.g., reactive ion etching process) in a capacitively coupled plasma (CCP) process chamber. For example, the CCP process chamber can be a same process chamber as various other operations described herein. The common chamber can decrease a number of processing operations, such as wafer handling and transportation operations. The removal of the mask 212 can be with a process which is selective to the mask 212 relative to the patternable layer 302 of operation 104, or a derivative thereof (e.g., a patterned layer). That is, the patternable layer 302 can define a pattern of openings 402 over the surface of the semiconductor device 200, wherein the depicted opening can be one of various such openings formed over a surface of the semiconductor device 200.

The opening 402 can extend through various further layers according to a same or different process. For example, nitride layers 208, such as silicon nitrides and oxide layers 210, such as silicon dioxide can be removed via plasma etching. Such layers can be removed via a same etchant employed at operation 112. For example, various fluorine-containing or fluorine-free etchants can be received into a plasma chamber (e.g., CCP chamber) to react with oxide or nitride layers and thereafter evacuated from the chamber. The etchants, flow rates, pressures, or other operating parameters for the chamber can vary between the operations described herein, or instances thereof. For example, the operating parameters can be configured to control a profile of sidewalls 404 of the opening 402. The sidewalls 404 can bow upwards or downwards. That is, the sidewalls can extend a lateral distance 406, defined by a difference between the opening 402 at an upper surface of the semiconductor device 200 (e.g., at the mask 212 layer), and a base of the opening (e.g., a surface of the first semiconductive layer 204). The lateral distance 406 can be positive, as depicted, or negative, as in the case of a re-entrant profile, for one or more vertical portions of the sidewalls 404. For example, a slope of the sidewall 404 can vary between various layers thereof.

The extension of the opening 402 can extend the opening 402 to a surface of the first semiconductive layer 204, as depicted, or somewhat into the first semiconductive layer 204. The completion of operation 106 or various sub-operations thereof can be determined according to a predetermined duration of etching or based on a detection of a position of a surface of the semiconductor device 200 (e.g., the first semiconductive layer 204). The position can be detected according to a measured depth of the opening 402, optical emission (e.g., according to a spectrometer or interferometer).

A density of the semiconductor device 200 can vary according to a lateral distance between the various openings, such that a lateral dimension of the opening itself, or spacing therebetween can impact device density (e.g., logic gates, memory cells, or other circuit elements per unit area).

Figure 5:
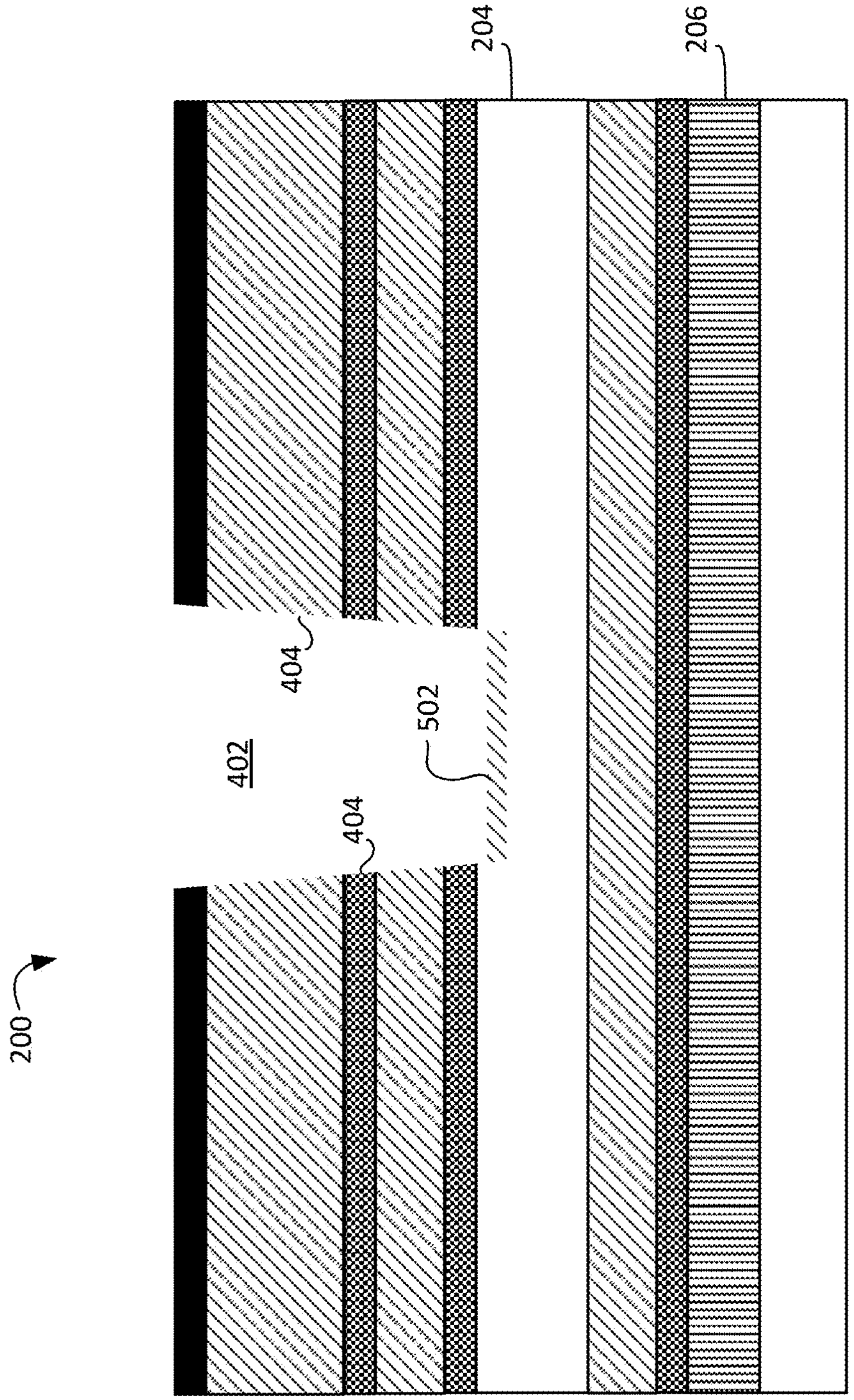

Corresponding to operation 108 of FIG. 1, FIG. 5 is a cross-sectional view of the semiconductor device 200 in which oxygen is flowed over the semiconductor device 200 to oxidize a semiconductive material, such as amorphous silicon (a-Si) of the first semiconductive layer 204. The oxygen can be introduced into a process chamber. For example, the process chamber can be a same process chamber as at least some of the other operations described herein. For example, the process chamber can include a CCP process chamber.

The oxygen can be flowed as $O_2$ or other oxygen containing gasses. For example, the oxygen can be introduced as carbon monoxide (CO), oxygen ($O_2$), carbon dioxide ($CO_2$), ozone ($O_3$), nitric oxide (NO), nitrogen dioxide ($NO_2$), sulfur dioxide ($SO_2$), or carbonyl sulfide (COS), combinations thereof, or the like. The gases can include or be combined with further gasses (e.g., nitrogen $N_2$) to control an oxygen flow rate and chamber temperature, to purge the chamber, or so forth. A flow rate or time for the oxygen can be configured to oxidize the surface of the first semiconductive layer 204, whereupon an oxidized surface 502 can protect further portions of the first semiconductive layer 204. For example, the oxidation of silicon to form silicon dioxide can form a layer inhibiting further oxidation of the silicon. That is, the formation of the silicon dioxide can protect underlying silicon, such that an oxidation of the silicon is limited according to a number of oxidation cycles (e.g., an atomic layer etching (ALE) process). The opening 402 can be extended through the silicon by repeating cycles of the oxidation, following removal of the oxidized layer (e.g., the method 100 can included repeating operation 108 and operation 112 to extend the opening 402 to a lower surface of the first semiconductive layer 204).

Figure 6:
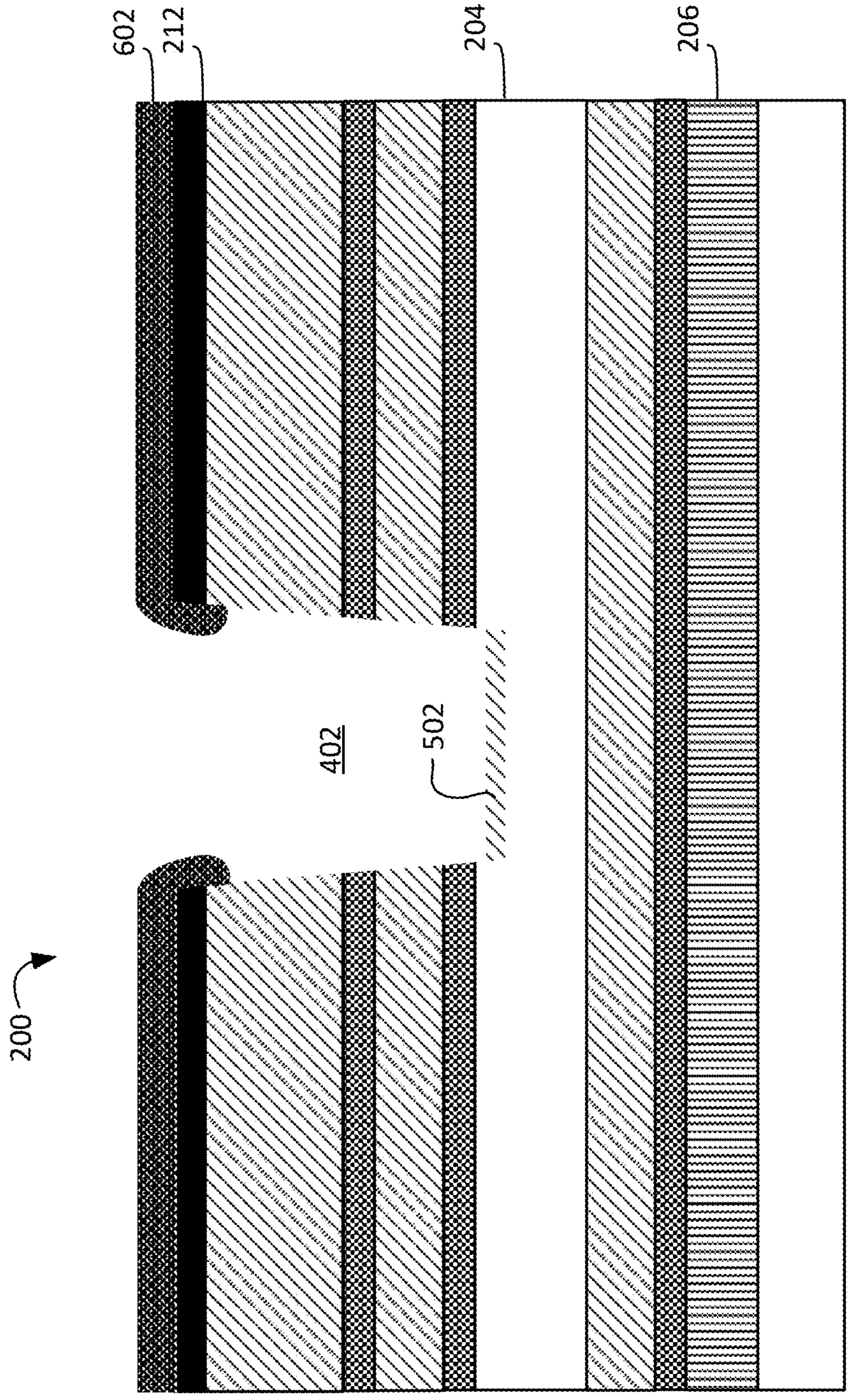

Corresponding to operation 110 of FIG. 1, FIG. 6 is a cross-sectional view of the semiconductor device 200 in which a protective layer 602 is formed over the surface of the semiconductor device 200. The protective layer 602 can be formed according to a deposition process, based on various precursors introduced into the chamber (e.g., the precursors can interact with each other or with exposed portions of the semiconductor device to form the protective layer 602). Operation 110 can be performed between operation 108 and operation 112 for some or all instances of operation 108 and operation 112. For example, the deposition of the protective layer 602 can be performed every cycle, every other cycle, etc. The protective layer 602 may also be referred to as a sacrificial layer wherein at least a portion of the protective layer 602 is removed by the etching of operation 112 (wherein the repetition of operation 110 rebuilds the protective layer 602). That is, the protective layer 602 can be a sacrificial layer to protect a mask 212 or other layers, and the other layers can protect the covered portion of the first semiconductive layer 204 from oxidation.

The protective layer 602 can be deposited according to any deposition process such as chemical vapor deposition (CVD), physical vapor deposition (PVD), or atomic layer deposition (ALD). In some embodiments, the protective layer 602 can be deposited according to a deposition process in the same CCP process chamber as other operations of the present disclosure. For example, a plasma-enhanced chemical vapor deposition process can deposit a film from one or more precursors introduced into the chamber. The precursors can be provided along with gasses to modify properties of a film, stabilize the plasma, or so forth. Depositing the protective layer 602 can include an introduction of gasses including methane (CH4), methyl fluoride ($CH_3F$), methylene fluoride ($CH_2F_2$), fluoroform ($CHF_3$), hexafluoro-1,3-butadiene ($C_4F_6$), octafluorocyclobutane ($C_4F_8$), hydrogen ($H_2$), oxygen ($O_2$), nitrogen ($N_2$), argon (Ar), helium (He), carbon dioxide ($CO_2$), carbon monoxide (CO), carbonyl sulfide (COS), or sulfur dioxide ($SO_2$), the like, or combinations thereof.

The protective layer 602 can form selectively over the mask 212 or other barrier layer between the first semiconductive layer 204, relative to surfaces of the opening 402. The selectivity can be based on chemical interaction with the mask 212, relative to any materials exposed along the sidewalls 404 of the opening 402, or the oxidized surface 502 of the first semiconductive layer 204. For example, the protective layer 602 can form at a lower rate over silicon dioxide or silicon nitride, relative to a tungsten based hardmask. The selectivity can be based on a geometry of the opening. For example, an aspect ratio of the opening 402 or an off-axis sheath direction of a CCP chamber can cause a protectant to form selectively over a surface of the semiconductor device 200, wherein shadowing effects of the opening can reduce protectant formed over the oxidized surface 502.

Figure 7:
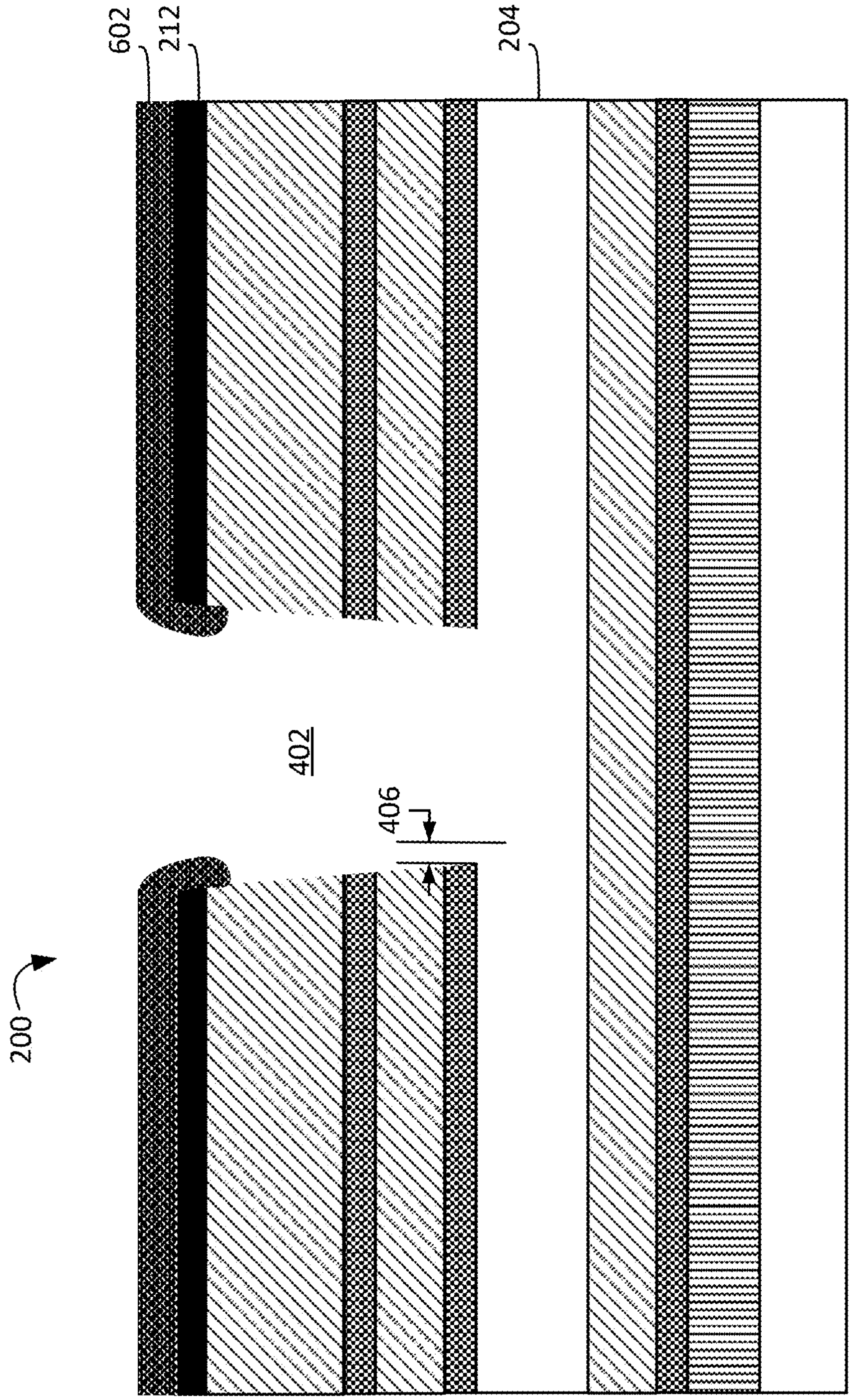

Corresponding to operation 112 of FIG. 1, FIG. 7 is a cross-sectional view of the semiconductor device 200 in which the oxidized surface 502 is removed. The removal of the oxidized surface 502 can reveal a surface of the semiconductive material of the first semiconductive layer 204 such that, at operation 108, the surface can be further oxidized to remove a further portion of the semiconductive material (e.g., silicon). A sidewall profile of the opening 402 can vary according to a growth of the oxidation layer and an etchant used. For example, a directional etch can substantially remove the oxidized surface 502 from the bottom of the opening 402, with relatively lower etching of the sidewalls 404. An etchant gas or precursor therefor introduced into a process chamber to remove the oxidized surface 502 can include methyl fluoride ($CH_3F$), difluoromethane ($CH_2F_2$), trifluoromethane ($CHF_3$), tetrafluoromethane ($CF_4$), hexafluoro-1,3-butadiene ($C_4F_6$), octafluorocyclobutane ($C_4F_8$), sulfur hexafluoride ($SF_6$), nitrogen trifluoride ($NF_3$), hydrogen ($H_2$), oxygen ($O_2$), nitrogen ($N_2$), argon (Ar), carbon dioxide ($CO_2$), carbon monoxide (CO), carbonyl sulfide (COS), or sulfur dioxide ($SO_2$), combinations thereof, or the like.

The energy, temperate, pressure, mix, or flow of the etchant gas can be configured to control a sidewall profile. For example, a lateral distance 406 from an upper surface of the first semiconductive layer 204 (e.g., an unoxidized surface, in contact with a layer formed there-over) to a bottom of the opening 402 can be about zero (e.g., slightly positive, as depicted, or slightly negative), or can maintain a sidewall profile of another portion of the sidewall 404. Thus, a sidewall profile can be controlled so as to reduce the lateral distance 406, relative to other approaches.

Figure 8:
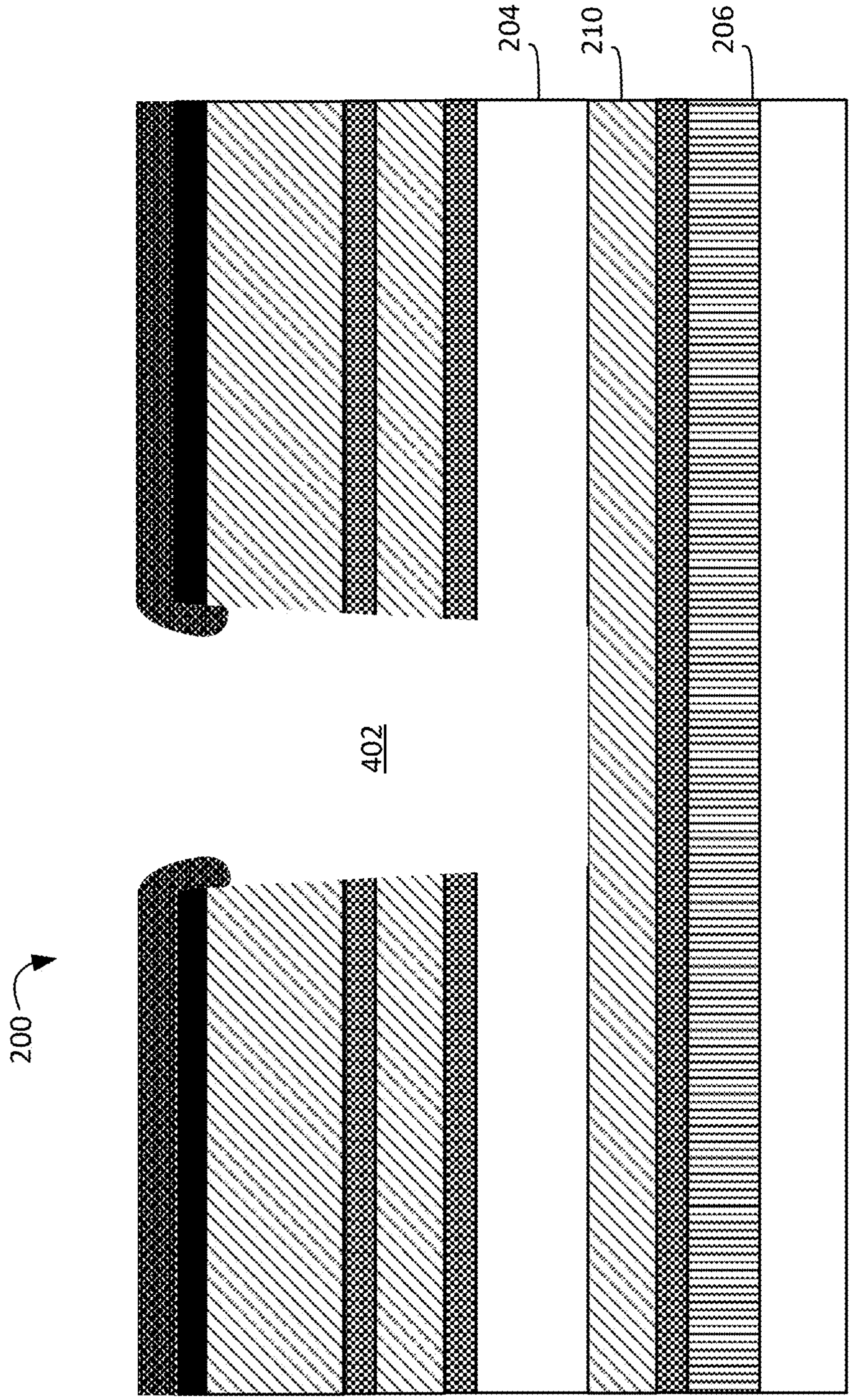

Corresponding to operation 114 of FIG. 1, FIG. 8 is a cross-sectional view of the semiconductor device 200 corresponding to a performance of end detection. End detection can refer to a detection of an extension of the opening 402 through the first semiconductive layer 204 to another layer disposed thereunder. For example, in the depicted example, the end detection detects the opening extending to an oxide layer 210 disposed below the first semiconductive layer 204. End detection can be performed according to a total time, cycle count, or other predetermined count of one or more other operations. For example, cycles of operation 108, operation 110, or operation 112 can be counted such that upon a predetermined number of performances thereof the method can proceed to operation 116. For example, based on a cycle count of the oxidation operation of operation 108, the method 100 can include determining that the opening has been extended through a semiconductive material, and proceed to operation 116, or has not extended through the semiconductive material, and can proceed to operation 108. In some embodiments, end detection can be performed based on a sensed distance to the bottom surface of the opening (e.g., a laser measure of reflectometry or an interferometer) or a chemistry based detection, such as via an optical emission spectrograph, as discussed above with regard to operation 106.

Figure 9:
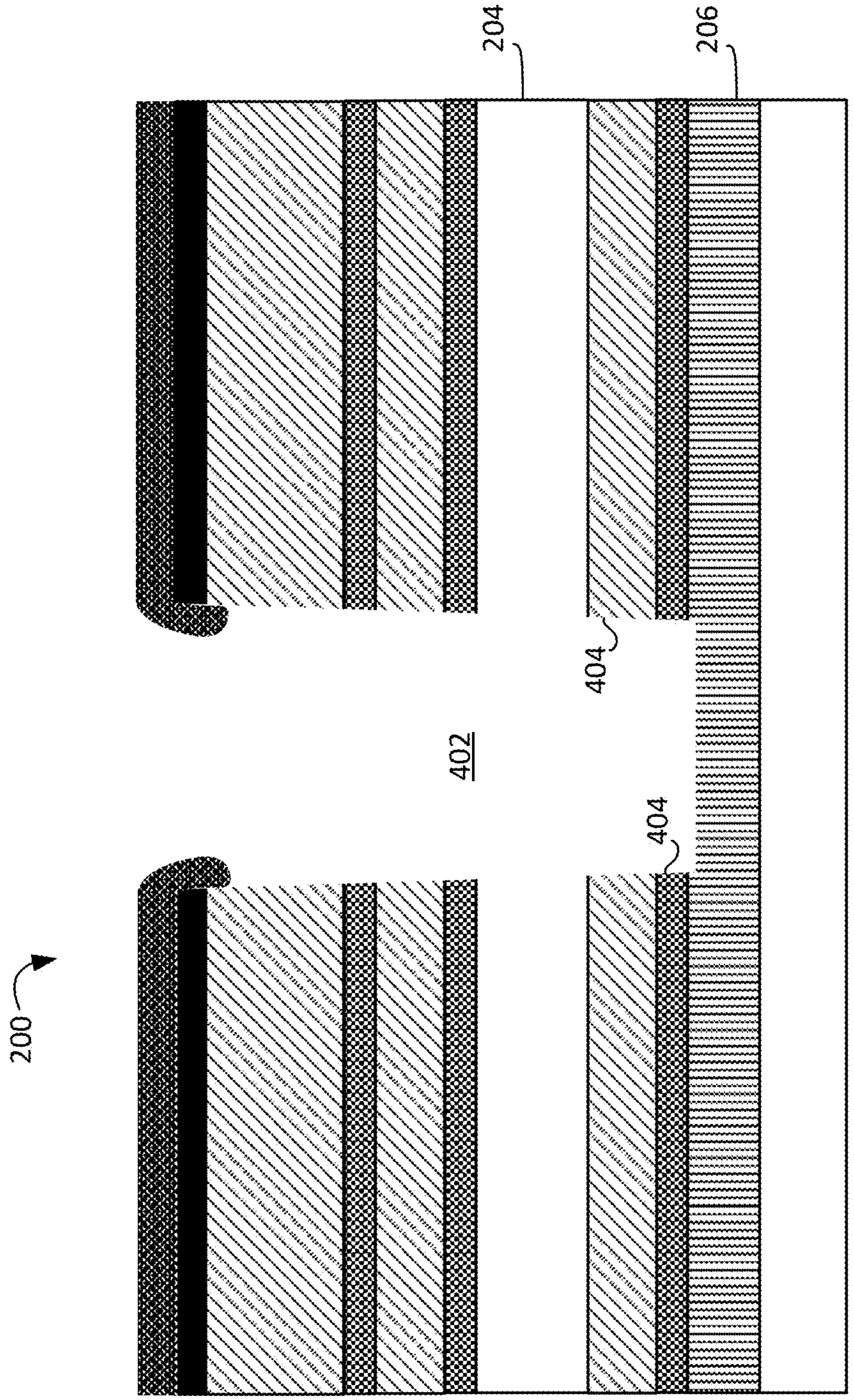

Corresponding to operation 116 of FIG. 1, FIG. 9 is a cross-sectional view of the semiconductor device 200 in which the opening 402 is extended to a second semiconductive layer 206. The second semiconductive layer 206 can be a same or different material as the first semiconductive layer 204. The second semiconductive layer 206 can include intrinsic or doped silicon-germanium. The first semiconductive layer 204 and second semiconductive layer 206 can be of different types. For example, the second semiconductive layer 206 can be a p-type silicon-germanium layer, such as silicon-germanium impregnated with Boron. The first semiconductive layer 204 can be an n-type silicon layer. The respective semiconductive layers 204, 206 can form channels for a first and second channel of first and second transistors of a CFET. Additional layers can be formed over or under the semiconductive layers 204, 206 for various further circuits. The openings can be filled to form interconnections between the respective semiconductive layers 204, 206.

In some embodiments, the depicted opening can correspond to a source/drain pair of the first and second transistors, and a further opening (not depicted) can correspond to a further source/drain. In some embodiments, spacers or other layers can be formed within the opening 402 prior to proceeding to operation 116, such that a conductive fill can connect to one sidewall 404 or other portion of the opening 402 (e.g., of a trench opening 402) and another portion can selectively connect to the various other portions. In some embodiments, the exposed surfaces of the semiconductive layers 204, 206 can be doped, or various layers (e.g., gate oxides, silicides, or other metal-semiconductor contact layers) can be deposited over all or a portion of the sidewall 404. Various such operations can be performed along various opening portions. For example, an (e.g., dielectric) fill can fill a vertical portion of the opening 402, or a longitudinal portion of the opening 402 (e.g., a trench opening 402), which can be filled with one or more dielectric or conductive materials (e.g., gate electrodes, spacers, and so forth).

Figure 10:
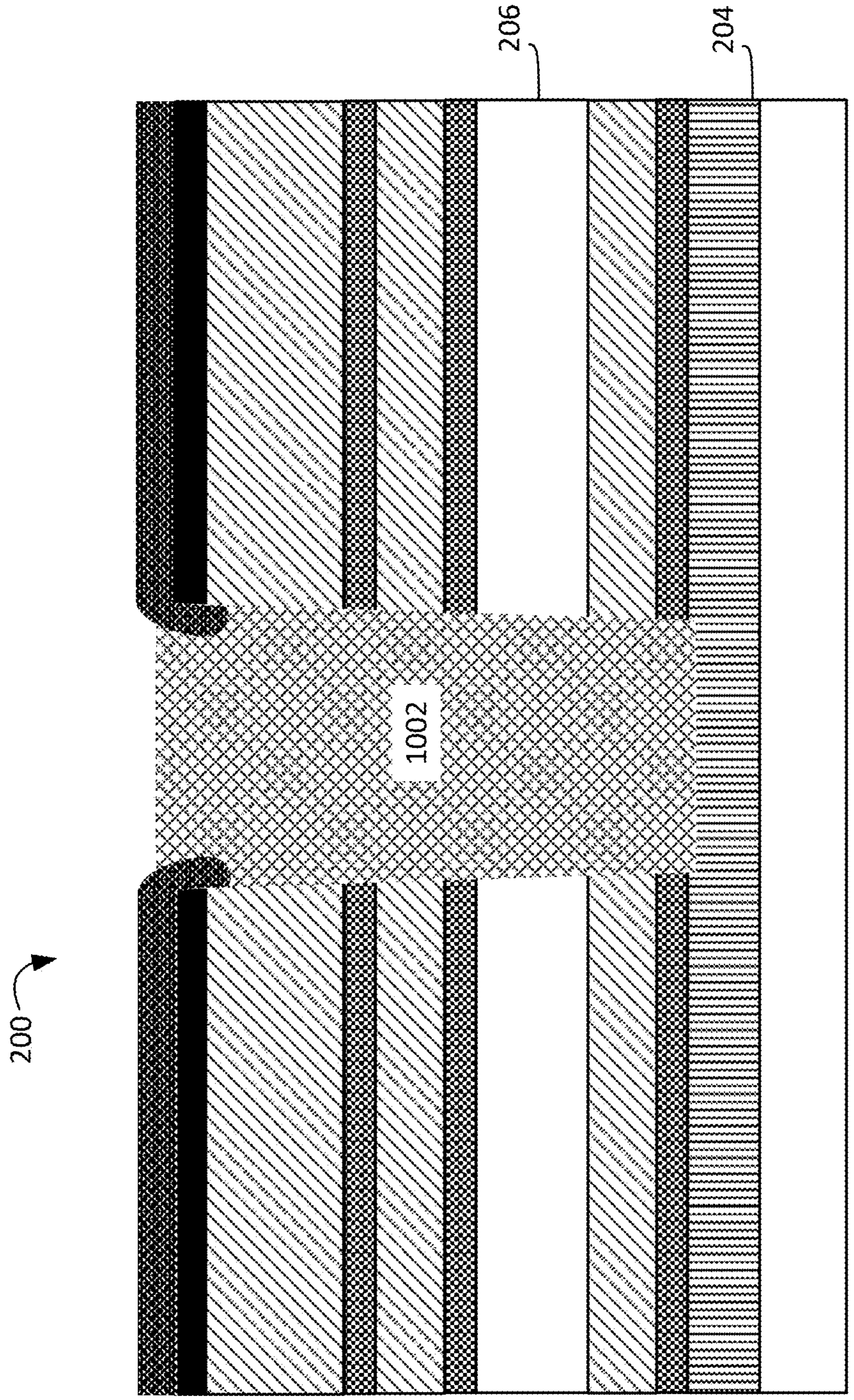

Corresponding to operation 118 of FIG. 1, FIG. 10 is a cross-sectional view of the semiconductor device 200 in which the opening 402 is filled with a conductive fill 1002, such as a metal contact. The conductive fill 1002 can be configured to interconnect portions of the semiconductor device 200 abutting the opening 402, or can form contacts to connect to such portions, such as to electrically couple the first semiconductive layer 204 with the second semiconductive layer 206. The respective semiconductive layers can be formed from different semiconductive materials, or types (e.g., an n-type semiconductor and a p-type semiconductor) to realize a CFET. As indicated above, the conductive fill 1002 can occupy all or a portion of the opening 402. For example, the depicted metal fill can vary from other portions of the opening 402 (e.g., extending into or out of the page).

Figure 11:
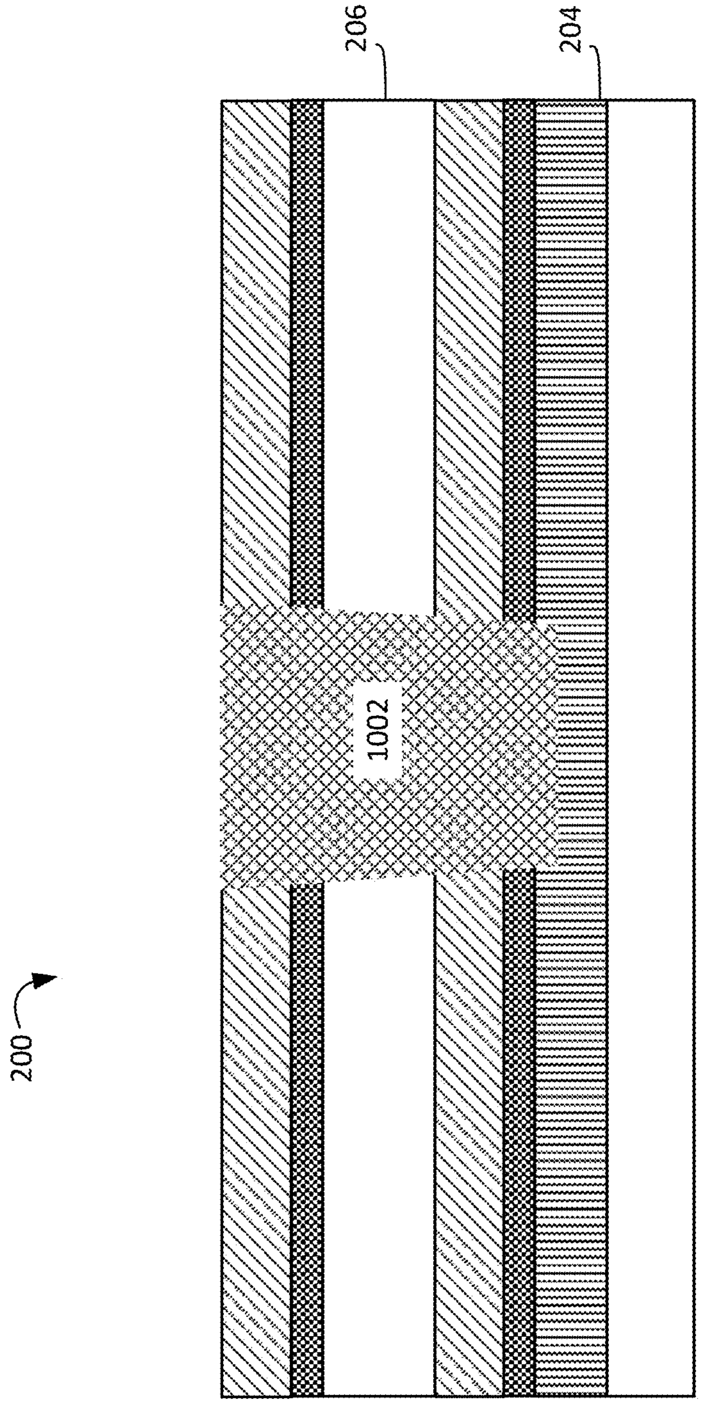

Corresponding to operation 120 of FIG. 1, FIG. 11 is a cross-sectional view of the semiconductor device 200 in which the protective layer 602 is removed. The protective layer 602 can be removed according to a chemical-mechanical grinding or polishing (CMP/G) operation. Such an operation can remove further layers of the semiconductor device 200, such as one or more overburden layers. The removal of the overburden layers (e.g., sacrificial nitride layers 208 or oxide layers 210) can reduce a lateral distance 406 of the sidewall (e.g., a sidewall taper distance). For example, flared, necked, or re-entrant profiles of an upper portion of the opening 402 can be removed, leaving a reduced lateral distance 406. In some embodiments, further cycles of the operation can be performed, such as to generate semiconductor devices 200 including multiple instances of the depicted stack up, which may be interconnected to form various logic or memory circuits.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:

forming a hardmask layer over a semiconductive layer;

forming an opening in the hardmask layer;

oxidizing a surface of the semiconductive layer;

depositing a sacrificial layer over the hardmask layer;

removing the oxidized surface of the semiconductive layer; and repeating the oxidation step, the deposition step, and the removal step to extend the opening through the semiconductive layer.

2. The method of claim 1, comprising:

detecting a position of the surface of the semiconductive layer; and adjusting a number of the repetitions of the oxidation step, the number based on the detected position.

3. The method of claim 1, wherein the oxidation step is repeated a predetermined number of times.

4. The method of claim 1, wherein:

a time, flow rate of an etchant, or quantity of repetitions of the removal step is varied between a first instance of the step and a second instance of the step, the variance configured to adjust a sidewall profile of the opening.

5. The method of claim 1, comprising:

extending the opening to a second semiconductive layer; and filling the opening with a conductive element to electrically couple the semiconductive layer with the second semiconductive layer, wherein the second semiconductive layer is of a different material or type than the semiconductive layer.

6. The method of claim 1, wherein the semiconductive layer comprises amorphous silicon.

7. The method of claim 1, wherein the sacrificial layer is formed from one or more precursors comprising:

methane ($CH_4$), methyl fluoride ($CH_3F$), methylene fluoride ($CH_2F_2$), fluoroform ($CHF_3$), hexafluoro-1,3-butadiene ($C_4F_6$), octafluorocyclobutane ($C_4F_8$), hydrogen ($H_2$), oxygen ($O_2$), nitrogen ($N_2$), argon (Ar), helium (He), carbon dioxide ($CO_2$), carbon monoxide (CO), carbonyl sulfide (COS), or sulfur dioxide ($SO_2$).

8. The method of claim 1, wherein the removal step comprises:

introducing an etchant gas to a process chamber, the etchant gas comprising:

methyl fluoride ($CH_3F$), difluoromethane ($CH_2F_2$), trifluoromethane ($CHF_3$), tetrafluoromethane ($CF_4$), hexafluoro-1,3-butadiene ($C_4F_6$), octafluorocyclobutane ($C_4F_8$), sulfur hexafluoride ($SF_6$), nitrogen trifluoride ($NF_3$), hydrogen ($H_2$), oxygen ($O_2$), nitrogen ($N_2$), argon (Ar), carbon dioxide ($CO_2$), carbon monoxide (CO), carbonyl sulfide (COS), or sulfur dioxide ($SO_2$).

9. The method of claim 8, wherein:

the process chamber is a capacitively coupled plasma (CCP) chamber; and the oxidation step and the deposition step are performed in the CCP chamber.

10. The method of claim 9, further comprising:

removing the hardmask layer, wherein a sidewall of the opening extends along:

a first oxide layer-nitride layer pair between the hardmask layer and the semiconductive layer; and a second oxide layer-nitride layer pair between the semiconductive layer and a second semiconductive layer.

11. The method of claim 1, wherein oxidizing the surface of the semiconductive layer comprises introducing an oxygen-based gas into a process chamber, the oxygen-based gas comprising:

carbon monoxide (CO), oxygen ($O_2$), carbon dioxide ($CO_2$), ozone ($O_3$), nitric oxide (NO), nitrogen dioxide ($NO_2$), sulfur dioxide ($SO_2$), or carbonyl sulfide (COS).

12. A method for fabricating semiconductor devices comprising:

providing a semiconductor device comprising:

a first semiconductive layer;

a second semiconductive layer;

a first dielectric portion between the first semiconductive layer and the second semiconductive layer; and a second dielectric portion between the first semiconductive layer and the second semiconductive layer; and forming an opening extending from a surface of the first semiconductive layer to the second semiconductive layer, the formation comprising:

oxidizing a surface of the first semiconductive layer;

depositing a sacrificial layer over the semiconductor device;

removing the oxidized surface of the first semiconductive layer; and repeating the oxidation step, the deposition step, and the removal step to extend the opening though the first semiconductive layer.

13. The method of claim 12, wherein:

the first semiconductive layer comprises amorphous silicon; and the second semiconductive layer comprises silicon-germanium and boron.

14. The method of claim 12, wherein the removal comprises introducing an etchant gas into a process chamber, the etchant gas comprising:

methyl fluoride ($CH_3F$), difluoromethane ($CH_2F_2$), trifluoromethane ($CHF_3$), tetrafluoromethane ($CF_4$), hexafluoro-1,3-butadiene ($C_4F_6$), octafluorocyclobutane ($C_4F_8$), sulfur hexafluoride ($SF_6$), nitrogen trifluoride ($NF_3$), hydrogen ($H_2$), oxygen ($O_2$), nitrogen ($N_2$), argon (Ar), carbon dioxide ($CO_2$), carbon monoxide (CO), carbonyl sulfide (COS), or sulfur dioxide ($SO_2$).

15. The method of claim 14, wherein the deposition step comprises introducing a precursor into the process chamber, the precursor comprising:

methane ($CH_4$), methyl fluoride ($CH_3F$), methylene fluoride ($CH_2F_2$), fluoroform ($CHF_3$), hexafluoro-1,3-butadiene ($C_4F_6$), octafluorocyclobutane ($C_4F_8$), hydrogen ($H_2$), oxygen ($O_2$), nitrogen ($N_2$), argon (Ar), helium (He), carbon dioxide ($CO_2$), carbon monoxide (CO), carbonyl sulfide (COS), or sulfur dioxide ($SO_2$).

16. The method of claim 15, wherein:

the oxidation step comprises passing oxygen over the surface of the first semiconductive layer in the process chamber; and the process chamber is a capacitively coupled plasma (CCP) chamber.

17. The method of claim 12, wherein:

the first dielectric portion comprises:

a first layer comprising an oxide material; and a second layer comprising a nitride material; and the second dielectric portion comprises:

a third layer comprising the oxide material; and a fourth layer comprising the nitride material.

18. A method for fabricating semiconductor devices comprising:

forming an oxide barrier layer over a silicon layer;

patterning the oxide barrier layer to form a plurality of openings, the plurality of openings extending to the silicon layer; and extending the plurality of openings by performing steps comprising:

oxidizing a surface of the silicon layer to form silicon dioxide;

depositing a sacrificial layer over the oxide barrier layer;

removing the silicon dioxide via an introduction of one or more etchant gasses selectively reactive to the silicon dioxide relative to silicon; and repeating the oxidation step, the deposition step, and the removal step to extend the openings through the silicon layer.

19. The method of claim 18, wherein the silicon layer consists substantially of amorphous silicon and one or more dopants.

20. The method of claim 18, wherein the oxidation step is repeated a predetermined number of times.

* * * * *